United States Patent
Hyun et al.

(10) Patent No.: US 9,797,954 B2
(45) Date of Patent: Oct. 24, 2017

(54) SYSTEM AND METHOD FOR MANAGEMENT OF CIRCUIT BREAKER COUNTER

(71) Applicant: KOREA ELECTRIC POWER CORPORATION, Naju-si, Jeollanam-do (KR)

(72) Inventors: Hye-Ryun Hyun, Busan (KR); Man-Sun Lee, Bucheon-si (KR); Kang-Soo Lee, Busan (KR); Jun-Soo Jang, Busan (KR); Hyo-Sung Song, Yangsan-si (KR); Il-Lae Jo, Busan (KR); En-Jin Sin, Busan (KR)

(73) Assignee: KOREA ELECTRIC POWER CORPORATION, Naju-si, Jeollanam-do (KR)

( * ) Notice: Subject to any disclaimer, the term of this patent is extended or adjusted under 35 U.S.C. 154(b) by 90 days.

(21) Appl. No.: 14/871,604

(22) Filed: Sep. 30, 2015

(65) Prior Publication Data
US 2016/0363628 A1    Dec. 15, 2016

(30) Foreign Application Priority Data
Jun. 12, 2015    (KR) ........................ 10-2015-0083580

(51) Int. Cl.
*G01R 31/02*    (2006.01)
*G01R 31/327*    (2006.01)
(Continued)

(52) U.S. Cl.
CPC ........... *G01R 31/333* (2013.01); *H01H 71/04* (2013.01); *H01H 2071/044* (2013.01)

(58) Field of Classification Search
CPC . G01R 31/333; H01H 71/04; H01H 2071/044
(Continued)

(56) References Cited

U.S. PATENT DOCUMENTS 2,580,304 A * 12/1951 Kraft ...................... H01H 75/04
218/157
4,562,398 A * 12/1985 Kotlarewsky ......... H02J 7/0075
320/128
(Continued)

FOREIGN PATENT DOCUMENTS

EP    0193732 A1    9/1986
EP    2555004 A1    2/2013
(Continued)

OTHER PUBLICATIONS

European Search Report dated Oct. 28, 2016 issued in European Patent Application No. 15187587.9.
(Continued)

*Primary Examiner* — Giovanni Astacio-Oquendo
(74) *Attorney, Agent, or Firm* — McDermott Will & Emery LLP

(57) ABSTRACT

A system for management of a circuit breaker counter according to an exemplary embodiment of the present invention includes a data processing unit receiving state change data and measurement data of at least one of a circuit breaker and a current measuring unit and transferring an event on the basis of the state change data and measurement data; and a counter managing unit counting a total operation, a load-breaking operation and a fault-breaking operation of the circuit breaker, based on the event and the measurement data, and outputting and storing respective count accumulation values.

7 Claims, 4 Drawing Sheets

(51) Int. Cl.
*G01R 31/333* (2006.01)
*H01H 71/04* (2006.01)

(58) Field of Classification Search
USPC .......................................... 324/424, 415, 418
See application file for complete search history.

(56) References Cited

U.S. PATENT DOCUMENTS

| | | | | |
|---|---|---|---|---|
| 4,589,052 | A * | 5/1986 | Dougherty | H02H 3/0935 361/94 |
| 4,627,407 | A * | 12/1986 | Betz | F02P 3/02 123/621 |
| 4,958,252 | A | 9/1990 | Murphy | |
| 5,517,381 | A * | 5/1996 | Guim | H01H 1/0015 361/102 |
| 6,289,267 | B1 | 9/2001 | Alexander et al. | |
| 8,071,901 | B2 * | 12/2011 | Poyner | H01H 27/002 200/334 |
| 2005/0225909 | A1 | 10/2005 | Yoshizaki et al. | |

FOREIGN PATENT DOCUMENTS

| | | |
|---|---|---|
| EP | 2573577 A2 | 3/2013 |
| EP | 2741387 A1 | 6/2014 |
| JP | 2000-222993 A | 8/2000 |
| JP | 2005-304148 A | 10/2005 |
| KR | 10-0186863 B1 | 5/1999 |
| KR | 10-0777828 B1 | 11/2007 |
| KR | 10-0783503 B1 | 12/2007 |
| KR | 10-1144310 B1 | 5/2012 |

OTHER PUBLICATIONS

Korean Office Action issued in Korean Application No. 10-2015-0083580, dated May 30, 2016.

* cited by examiner

| SUBSTATION | VOLTAGE | CIRCUIT BREAKER NUMBER | CIRCUIT BREAKER | TOTAL COUNTER | | FAULT-BREAKING COUNT | | LOAD-BREAKING COUNTER | | REMARK |
|---|---|---|---|---|---|---|---|---|---|---|
| | | | | ACCU-MULATION | RESET | ACCU-MULATION | RESET | ACCU-MULATION | RESET | |
| GUANG S/S | 154kV | 6133 | ☐ | 156 | 0 ■ | 2 | 0 ■ | 24 | 0 ■ | |
| | | 6233 | ☐ | 242 | 0 ■ | 3 | 0 ■ | 48 | 0 ■ | |
| | | 6333 | ☐ | 211 | 0 ■ | 1 | 0 ■ | 141 | 0 ■ | |
| | | 617 | ☐ | 363 | 0 ■ | 2 | 0 ■ | 102 | 0 ■ | |
| | | 627 | ■ | 322 | 0 ■ | 20 | 0 ■ | 124 | 0 ■ | PRECISE CHECK |
| | | 637 | ☐ | 167 | 0 ■ | 3 | 0 ■ | 19 | 0 ■ | |
| | | 647 | ☐ | 723 | 0 ■ | 5 | 0 ■ | 215 | 0 ■ | |
| | | 657 | ☐ | 56 | 1 ■ | 6 | 1 ■ | 11 | 0 ■ | |
| | | 6100 | ☐ | 544 | 0 ■ | 0 | 0 ■ | 211 | 0 ■ | |
| | 23kV | 4144 | ☐ | 2541 | 0 ■ | 64 | 0 ■ | 631 | 0 ■ | |
| | | 4244 | ☐ | 2526 | 0 ■ | 74 | 0 ■ | 234 | 0 ■ | |
| | | 4344 | ☐ | 2398 | 0 ■ | 64 | 0 ■ | 693 | 0 ■ | |
| | | 417 | ☐ | 2644 | 2 ■ | 51 | 0 ■ | 933 | 0 ■ | |
| | | 427 | ☐ | 2614 | 5 ■ | 42 | 0 ■ | 234 | 0 ■ | |
| | | 437 | ☐ | 2578 | 0 ■ | 65 | 2 ■ | 327 | 2 ■ | |
| | | 447 | ☐ | 3001 | 0 ■ | 128 | 0 ■ | 2000 | 0 ■ | PRECISE CHECK |
| | | 457 | ☐ | 2397 | 0 ■ | 46 | 2 ■ | 684 | 2 ■ | |
| | | 467 | ☐ | 2456 | 0 ■ | 35 | 0 ■ | 257 | 0 ■ | |
| | | 477 | ☐ | 2621 | 0 ■ | 31 | 0 ■ | 422 | 0 ■ | |
| | | 4100 | ☐ | 2241 | 3 ■ | 56 | 0 ■ | 283 | 0 ■ | |
| | | 4200 | ☐ | 2310 | 2 ■ | 46 | 0 ■ | 389 | 0 ■ | |
| | | 40-41-0 | ☐ | 2195 | 2 ■ | 45 | 1 ■ | 245 | 1 ■ | |
| | | 45-46-0 | ☐ | 2174 | 6 ■ | 74 | 0 ■ | 237 | 0 ■ | |
| | | 41-42-0 | ☐ | 2142 | 4 ■ | 62 | 0 ■ | 325 | 0 ■ | |
| | | 46-47-0 | ☐ | 2135 | 2 ■ | 41 | 0 ■ | 422 | 0 ■ | |

FIG. 3

| SUBSTATION | GIJANG | CIRCUIT BREAKER NUMBER | 617 | REMARK | SINYANGSAN-GIJANG#1T/L |
|---|---|---|---|---|---|
| EVENT CONTENT ||||||
| DATA | TIME | BREAK LOAD | CLASSIFICATION | CUMULATIVE NUMBER OF EACH BREAKING TYPE | A TOTAL CUMULATIVE NUMBER | REMARK |
| 15'01.13 | 13:12:012 | 60MW | LOAD-BREAKING | 22 | 31 | |
| 15'01.11 | 09:30:164 | 100MW | LOAD-BREAKING | 21 | 30 | |
| 14'11.15 | 09:40:164 | 64MW | LOAD-BREAKING | 20 | 29 | |
| 14'10.14 | 09:30:164 | 74MW | LOAD-BREAKING | 19 | 28 | |
| 14'07.17 | 08:54:024 | 57MW | LOAD-BREAKING | 18 | 27 | |
| 14'04.21 | 09:30:164 | 55MW | LOAD-BREAKING | 17 | 26 | |
| 14'01.19 | 14:19:325 | 63MW | LOAD-BREAKING | 16 | 25 | |
| 13'11.21 | 09:30:164 | 77MW | LOAD-BREAKING | 15 | 24 | |
| 13'10.01 | 21:12:012 | 3647MW | FAULT-BREAKING | | 23 | |
| 13'09.22 | 22:12:542 | 84MW | LOAD-BREAKING | 14 | 22 | |
| 13'07.30 | 02:54:212 | 74MW | LOAD-BREAKING | 13 | 21 | |
| 13'07.28 | 14:12:012 | 98MW | LOAD-BREAKING | 12 | 20 | |
| 13'02.25 | 05:22:201 | 101MW | LOAD-BREAKING | 11 | 19 | |
| 13'01.04 | 10:14:011 | 103MW | LOAD-BREAKING | 10 | 18 | |
| 12'12.27 | 21:12:124 | 79MW | LOAD-BREAKING | 9 | 17 | |
| 12'11.02 | 08:01:041 | 7601MW | FAULT-BREAKING | 2 | 16 | |
| 12'11.02 | 08:01:012 | 8658MW | FAULT-BREAKING | 1 | 15 | |
| 12'09.30 | 10:15:482 | 74MW | LOAD-BREAKING | 8 | 14 | |
| 12'09.10 | 10:02:126 | 82MW | LOAD-BREAKING | 7 | 13 | |
| 12'08.30 | 16:48:142 | 0MW | NO-LOAD-BREAKING | 6 | 12 | |
| 12'08.30 | 16:42:654 | 0MW | NO-LOAD-BREAKING | 5 | 11 | |
| 12'08.30 | 16:38:012 | 0MW | NO-LOAD-BREAKING | 4 | 10 | |
| 12'08.30 | 16:37:599 | 0MW | NO-LOAD-BREAKING | 3 | 9 | |
| 12'08.30 | 16:35:142 | 0MW | NO-LOAD-BREAKING | 2 | 8 | |
| 12'08.30 | 15:12:012 | 0MW | NO-LOAD-BREAKING | 1 | 7 | |
| 12'07.01 | 09:42:012 | 67MW | LOAD-BREAKING | 6 | 6 | |
| 12'02.15 | 09:19:412 | 78MW | LOAD-BREAKING | 5 | 5 | |
| 12'02.12 | 11:10:021 | 86MW | LOAD-BREAKING | 4 | 4 | |
| 12'02.01 | 10:42:542 | 86MW | LOAD-BREAKING | 3 | 3 | |
| 12'02.01 | 14:06:874 | 90MW | LOAD-BREAKING | 2 | 2 | |
| 15'01.15 | 09:05:486 | 79MW | LOAD-BREAKING | 1 | 1 | |

FIG. 4

SYSTEM AND METHOD FOR MANAGEMENT OF CIRCUIT BREAKER COUNTER

CROSS-REFERENCE TO RELATED APPLICATION

This application claims the priority and benefit of Korean Patent Application No. 10-2015-0083580 filed on Jun. 12, 2015, with the Korean Intellectual Property Office, the disclosure of which is incorporated herein by reference.

BACKGROUND

The present inventive concept relates to a system and a method for management of a circuit breaker counter in consideration of types of a break load.

When a circuit breaker breaks a high current such as a fault current or the like, the interior of the circuit breaker may be damaged by an electrical arc and the like, and, accordingly, maintenance thereof according to types of a break load may be important.

In an existing circuit breaker counter, a mechanical counter connected to a circuit breaker operating rod, defects such as a discrepancy in the number of operations due to breakdowns caused by impacts and the like according to the movement of the circuit breaker may frequently occur.

In addition, the mechanical counter may not consider whether fault-breaking, load-breaking, or the like, occurs, and may only combine breaking operations to recognize the total number of operations.

In the case of an electronic circuit breaker counter currently being studied, it is infeasible to confirm the number of operations in real time, and, accordingly, the number of operations should be visually confirmed and recorded on the spot, thereby resulting in inefficiency. Further, it is necessary to install a counter in each circuit breaker, thereby leading to an increase in costs.

The related art technique related to a circuit breaker counter will be understood with reference to the following patent publication.

(Patent Publication 1) Korean Patent Laid-Open Publication No. 2012-0044576

SUMMARY

An aspect of the present inventive concept may provide a system and a method for management of a circuit breaker counter, capable of outputting and storing, in real time, count accumulation values according to types of a break load of a circuit breaker by utilizing state change data and measurement data that are being pre-obtained, thereby determining whether or not to perform a checking operation according to degradation in the function of the circuit breaker.

According to an aspect of the present inventive concept, a system for management of a circuit breaker counter may include: a data processing unit receiving state change data and measurement data of at least one of a circuit breaker and a current measuring unit and transferring an event on the basis of the state change data and measurement data; and a counter managing unit counting a total operation, a load-breaking operation and a fault-breaking operation of the circuit breaker, based on the event and the measurement data, and outputting and storing respective count accumulation values.

According to another aspect of the present inventive concept, a method for management of a circuit breaker counter may include: receiving state change data and measurement data of at least one of the circuit breaker and the current measuring unit, and transferring an event on the basis of the state change data and measurement data; accumulating a total count according to a circuit breaker operation event; accumulating a load-breaking count when a break load is present, a relay trip event does not occur, and, after a break, a load is not present; and accumulating a fault-breaking count when the break load is present, the relay trip event occurs, and, after the break, a load is not present.

BRIEF DESCRIPTION OF DRAWINGS

The above and other aspects, features and advantages of the present inventive concept will be more clearly understood from the following detailed description taken in conjunction with the accompanying drawings, in which:

FIG. 3 illustrates a screen displaying count accumulation values of circuit breakers, output by the system for management of the circuit breaker counter according to an exemplary embodiment of the present inventive concept; and FIG. 4 illustrates a screen displaying count accumulation values of a predetermined circuit breaker, output by the system for management of the circuit breaker counter according to an exemplary embodiment of the present inventive concept.

DETAILED DESCRIPTION

Figure 1:
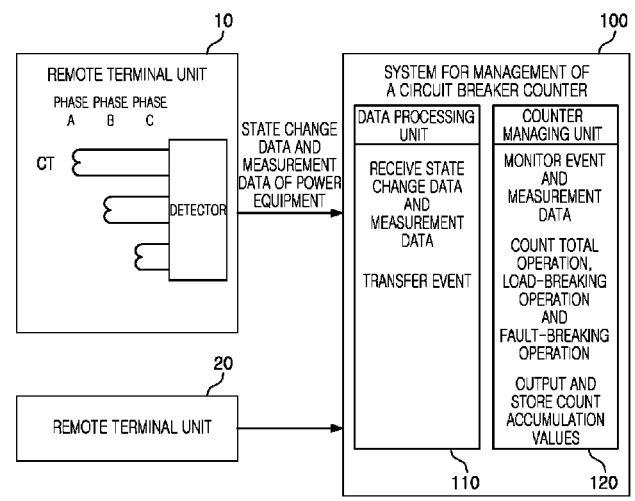
FIG. 1 is a block diagram illustrating a system for management of a circuit breaker counter according to an exemplary embodiment of the present inventive concept.

Exemplary embodiments of the present inventive concept will now be described in detail with reference to the accompanying drawings.

The inventive concept may, however, be exemplified in many different forms and should not be construed as being limited to the specific embodiments set forth herein. Rather, these embodiments are provided so that this disclosure will be thorough and complete, and will fully convey the scope of the inventive concept to those skilled in the art.

In the drawings, the shapes and dimensions of elements may be exaggerated for clarity, and the same reference numerals will be used throughout to designate the same or like elements.

FIG. 1 is a block diagram illustrating a system for management of a circuit breaker counter according to an exemplary embodiment of the present inventive concept.

Referring to FIG. 1, a system 100 for management of a circuit breaker counter according to an exemplary embodiment of the present inventive concept may include a data processing unit 110 and a counter managing unit 120.

The data processing unit 110 may receive state change data and measurement data of at least one of a circuit breaker and a current measuring unit and receive an event on the basis of the state change data and measurement data, and may transfer the event to the counter managing unit 120.

A remote terminal unit 10 may be a device installed in a substation and a power plant in order to transmit the state change data and measurement data of the circuit breaker and the current measuring unit, and the event on the basis of the data to the system 100 for management of a circuit breaker counter, through the data processing unit 110.

The remote terminal unit 10 may include a detector receiving a current from a current transformer (CT) and converting the current into the measurement data, and may gather pieces of the state change data indicating operations of the circuit breaker.

That is, the remote terminal unit 10 may obtain data of power equipment including the circuit breaker and the current measuring unit and may transmit the data to the system 100 for management of a circuit breaker counter, a system for controlling a high power system.

Here, the system 100 for management of a circuit breaker counter may receive state change data and measurement data of the power equipment, and an event on the basis of the data from a plurality of remote terminal units 10, 20, and the like.

The counter managing unit 120 may count a total operation, a load-breaking operation, and a fault-breaking operation of the circuit breaker based on the event, and the measurement data and may output and store respective count accumulation values.

In addition, the counter managing unit 120 may determine the arrival of a checking time based on the count accumulation values and may output a result of the determination.

The counting of the load-breaking operation may be performed under conditions in which a circuit breaker operation event occurs, a break load is higher than a reference value, and, after a break, a load is lower than the reference value, and a relay trip event does not occur.

In addition, the counting of the fault-breaking operation may be performed under conditions in which a circuit breaker operation event occurs, a break load is higher than a reference value and after a break, a load is lower than the reference value, and a relay trip event occurs.

Here, the reference value may be set to be one of 1 A, 1 MW, and 1 kV, byway of example, but a concrete numerical value thereof may be adjusted if necessary.

In addition, the counting of the fault-breaking operation may be performed under conditions in which a determination by fault determination logic on the basis of the measurement data is added.

By way of example, the fault determination logic may determine that a fault occurs in the case that a measured current value of the measurement data is greater than a fault current-setting value, and after a voltage of a power distribution line (PL) becomes a zero-voltage, the zero-voltage is maintained for a predetermined amount of time.

The fault determination logic may be variously modified based on the measurement data.

Also, the counter managing unit 120 may separately count the total operation, the load-breaking operation and the fault-breaking operation after resetting, and may output and store respective reset count accumulation values.

For example, the counter managing unit 120 may accumulate a first total count, a second total count, a first load-breaking count, a second load-breaking count, a first fault-breaking count, and a second fault-breaking count.

Here, the first total count, the first load-breaking count, and the first fault-breaking count may be count accumulation values continuously accumulated from a first initiation time, and may be continuously accumulated even in a case in which they are reset by a user and the like.

In addition, the second total count, the second load-breaking count, and the second fault-breaking count may be reset count accumulation values, count accumulation values accumulated after being reset by a user and the like.

Meanwhile, the system 100 for management of a circuit breaker counter may be included in a supervisory control and data acquisition (SCADA) system or may be connected to the SCADA system in order to obtain the state change data and the measurement data of the circuit breaker and the current measuring unit, which are being pre-obtained in the SCADA system connected to a substation.

Also, the term '~unit' used in the present embodiment is defined as software or a hardware component such as an FPGA (field programmable gate array) or ASIC, and '~unit' performs certain functions. However, '~unit' is not limited to software or hardware. Thus, '~unit' may be configured to exist in an addressable storage medium and also may be configured to execute one or more processors. Therefore, as one example, '~unit' includes constituents such as software components, object-oriented software components, class components and task components, processes, functions, attributes, procedures, subroutines, segments in a program code, drivers, firmware, a microcode, a circuit, data, a database, data structures, tables, arrays, and variables. Components and a function provided in 'unit(s)' can be coupled to a smaller number of components and 'unit(s)' or more divided to further components and 'unit(s)'. In addition, components and 'unit(s)' may be implemented to execute one or more CPUs in a device or a system.

Accordingly, since the system for management of a circuit breaker counter may output and store, in real time, count accumulation values according to types of a break load of a circuit breaker by obtaining state change data and measurement data, costs required therefor may be reduced as compared to a system in which a counter is installed in each circuit breaker, a database of information regarding the circuit breaker counter may be provided, and it may be determined whether or not to perform a checking operation according to degradation in the function of the circuit breaker.

Figure 2:
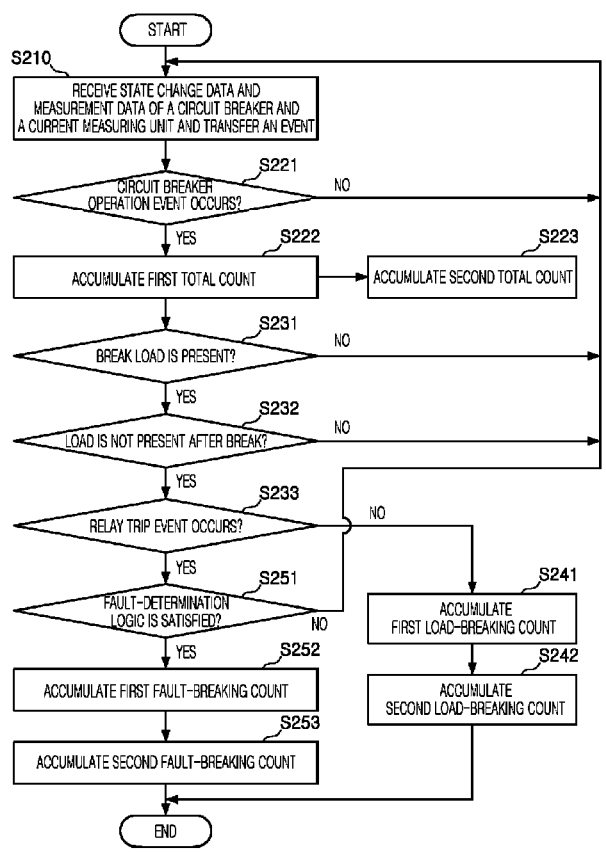
FIG. 2 is a flowchart illustrating a method for management of a circuit breaker counter according to an exemplary embodiment of the present inventive concept.

FIG. 2 is a flow chart illustrating a method for management of a circuit breaker counter according to an exemplary embodiment of the present inventive concept.

Referring to FIG. 2, the method for management of a circuit breaker counter according to an exemplary embodiment of the present inventive concept may start with receiving state change data and measurement data of at least one of the circuit breaker and the current measuring unit, and transferring an event on the basis of the state change data and measurement data (S210).

Thereafter, the occurrence of a circuit breaker operation event is monitored (S221), and when the circuit breaker operation event occurs, a total count may be accumulated (S222).

Then, it may be monitored that a break load is present (S231), and after a break, it is monitored that a load is not present (S232).

Here, the break load may be present when it is higher than a reference value, and, after the break, a load may not be present in a case in which it is lower than the reference value.

Here, the reference value may be set to be one of 1 A, 1 MW, and 1 kV, by way of example, but a concrete numerical value thereof may be adjusted if necessary.

When that the break load is present, and, after the break, a load is not present, whether or not the relay trip event occurs is monitored (S233).

Here, the order of monitoring the presence of the break load, the non-presence of a load after the break, and whether or not the relay trip event occurs may be changed.

Next, when the break load is present, the relay trip event does not occur, and after the break, a load is not present, a load-breaking count may be accumulated (S241).

In addition, when the break load is present, the relay trip event occurs, and after the break, a load is not present, a fault-breaking count may be accumulated (S252).

Meanwhile, whether or not to satisfy fault determination logic on the basis of the measurement data may be added as a condition of accumulating the fault-breaking count (S251).

That is, when the break load is present, the relay trip event occurs, a load is not present after the break, and the fault determination logic is satisfied, the fault-breaking count may be accumulated (S252).

In addition, the accumulating of the total count, the accumulating of the load-breaking count, and the accumulating of the fault-breaking count may further include separately counting and accumulating the total operation, the load-breaking operation and the fault-breaking operation after resetting.

In more detail, when the circuit breaker operation event occurs, a first total count may be accumulated (S222), and, separately, a second total count may be accumulated (S223).

In addition, when a first load-breaking count is accumulated (S241), a second load-breaking count may be separately accumulated (S242).

In addition, when a first fault-breaking count is accumulated (S252), a second fault-breaking count may be separately accumulated (S253).

Here, the first total count, the first load-breaking count, and the first fault-breaking count may be count accumulation values continuously accumulated from a first initiation time, and may be continuously accumulated even in a case in which they are reset by a user and the like.

In addition, the second total count, the second load-breaking count, and the second fault-breaking count may be reset count accumulation values accumulated after being reset by a user and the like.

Accordingly, data for evaluating degradation in the function of a circuit breaker and soundness thereof according to types of a break load of a power system may be calculated, and thus the efficiency of the maintenance of power equipment may be improved.

FIG. 3 illustrates a screen displaying count accumulation values of circuit breakers, output by the system for management of the circuit breaker counter according to an exemplary embodiment of the present inventive concept.

Referring to FIG. 3, according to a circuit breaker in the exemplary embodiment, it could be confirmed that an operation of a circuit breaker (circuit breaker number 627) is displayed in real time by toggling the color-conversion of a circuit breaker icon.

In addition, it could be confirmed that a total count accumulation value, a fault-breaking count accumulation value, and a load-breaking count accumulation value after a first initiation time, and the respective count accumulation values after resetting, may be separately counted and displayed.

FIG. 4 illustrates a screen displaying count accumulation values of a predetermined circuit breaker, output by the system for management of the circuit breaker counter according to an exemplary embodiment of the present inventive concept.

Referring to FIG. 4, in the exemplary embodiment, it could be confirmed that the count accumulation values of a predetermined circuit breaker (circuit breaker number 617) according to type of a break load, together with data and time of the breaking operation, may be displayed.

As set forth above, the system and method for management of a circuit breaker counter according to exemplary embodiments of the present inventive concept may output and store, in real time, count accumulation values according to types of a break load of a circuit breaker by utilizing state change data and measurement data that are being pre-obtained, thereby determining whether or not to perform a checking operation according to degradation in the function of the circuit breaker.

While exemplary embodiments have been shown and described above, it will be apparent to those skilled in the art that modifications and variations could be made without departing from the scope of the invention as defined by the appended claims.

What is claimed is:

1. A system for management of a circuit breaker counter, the system comprising:
a data processing unit receiving state change data and measurement data of at least one of a circuit breaker and a current measuring unit and transferring an event on the basis of the state change data and measurement data; and
a counter managing unit counting a total operation, a load-breaking operation and a fault-breaking operation of the circuit breaker based on the event and the measurement data, and outputting and storing respective count accumulation values.

2. The system of claim 1, wherein the counter managing unit determines an arrival of a checking time based on the count accumulation values and outputs a result of the determination.

3. The system of claim 1, wherein the counting of the load-breaking operation is performed under conditions in which a circuit breaker operation event occurs, a break load is higher than a reference value, and, after a break, a load is lower than the reference value, and a relay trip event does not occur.

4. The system of claim 1, wherein the counting of the fault-breaking operation is performed under conditions in which a circuit breaker operation event occurs, a break load is higher than a reference value, and, after a break, a load is lower than the reference value, and a relay trip event occurs.

5. The system of claim 4, wherein the counting of the fault-breaking operation is performed under conditions in which a determination by fault determination logic on the basis of the measurement data is added.

6. The system of claim 1, wherein the counter managing unit separately counts the total operation, the load-breaking operation and the fault-breaking operation after resetting, and outputs and stores respective reset count accumulation values.

7. The system of claim 5, wherein the fault determination logic determines that a fault occurs in the case that a measured current value of the measurement data is greater than a fault current-setting value, and after a voltage of a power distribution line (PL) becomes a zero-voltage, the zero-voltage is maintained for a predetermined amount of time.

* * * * *